United States Patent [19]

Nagasawa

[11] Patent Number: 4,644,501
[45] Date of Patent: Feb. 17, 1987

[54] SEMICONDUCTOR MEMORY DEVICE WITH CHARGING CIRCUIT

[75] Inventor: Masanori Nagasawa, Kamakura, Japan

[73] Assignee: Fujitsu Limited, Kawasaki, Japan

[21] Appl. No.: 680,125

[22] Filed: Dec. 10, 1984

[30] Foreign Application Priority Data

Dec. 12, 1983 [JP] Japan .................................. 58-234014

[51] Int. Cl.$^4$ ................................................ G11C 7/00
[52] U.S. Cl. ...................................... 365/203; 365/210
[58] Field of Search ................................. 365/203, 210

[56] References Cited

U.S. PATENT DOCUMENTS 4,044,341  8/1977  Stewart et al. ...................... 365/203
4,371,956  2/1983  Maeda et al. ...................... 365/210

Primary Examiner—James W. Moffitt
Attorney, Agent, or Firm—Armstrong, Nikaido, Marmelstein & Kubovcik

[57] ABSTRACT

A semiconductor memory device, such as a mask ROM device, wherein precharge time is controlled by the chargeup level of a dummy bit line. The semiconductor memory device comprises a gate circuit for selecting a desired bit line, a dummy bit line having a chargeup characteristic equivalent to that of each of the bit lines, a dummy bit line chargeup circuit for charging the dummy bit line, and a chargeup circuit for charging up the selected bit line from the time the bit line is selected to the time the chargeup of the dummy bit line is finished, on the basis of the chargeup level of the dummy bit line, thereby enabling chargeup of the selected bit line for the necessary period without the intervention of excess time.

13 Claims, 4 Drawing Figures

SEMICONDUCTOR MEMORY DEVICE WITH CHARGING CIRCUIT

BACKGROUND OF THE INVENTION (1) Field of the Invention

The present invention relates to a semiconductor memory device, more particularly, it relates to a semiconductor memory device having a bit line chargeup circuit which charges a bit line within a minimum time period to ensure a fast readout operation.

(2) Description of the Related Art

In a semiconductor memory device such as a ROM device operating synchronously with clock signals, a bit line is charged up before reading out data therefrom. Depending on the memory content of the memory cell, the level of the bit line is either held at the precharging level or changed. By sensing the potential level of the bit line, the content of the memory is read out. This is made wide use of in semiconductor memory devices of the synchronous type.

Conventionally, precharging is usually performed by temporarily connecting a bit line to a power source. This connection is effected by applying a pulse of a fixed width to a switching transistor at predetermined timings to turn the transistor ON. However, with this method, it is difficult to set the width and timing of the pulse to the optimal values and some margin of error must be provided to ensure reliability of operation, resulting in some waste of access time. Specifically, in a memory device, there are many bit lines and the rising characteristics thereof differ. Therefore, the pulse width is determined as the time required for the precharging of the bit line with the slowest rising characteristics, plus a certain time (margin of error). The precharge timing is made the point of time before readout, wherein the precharging can be sufficiently effected (i.e., the pulse width can be secured). The pulse width, etc. includes elements of guesswork, therefore, to ensure reliability of operation, it must be made larger. In practice, therefore, a certain excess width is unavoidable.

SUMMARY OF THE INVENTION

It is an object of the present invention to provide a memory device having a bit line chargeup circuit which can charge up a bit line with the minimum necessary width of time, thereby preventing any waste of time and shortening the access time of the memory device.

According to the present invention, there is provided a semiconductor memory device comprising: a plurality of bit lines; a gate circuit for selecting a desired bit line; a dummy bit line having the chargeup characteristic equivalent to that of each of the bit lines; a dummy bit line chargeup circuit for charging the dummy bit line; and a chargeup circuit for charging up the selected bit line from the time the bit line is selected to the time the chargeup of the dummy bit line is finished on the basis of the chargeup level of the dummy bit line.

DESCRIPTION OF THE PREFERRED EMBODIMENTS

Figure 1:
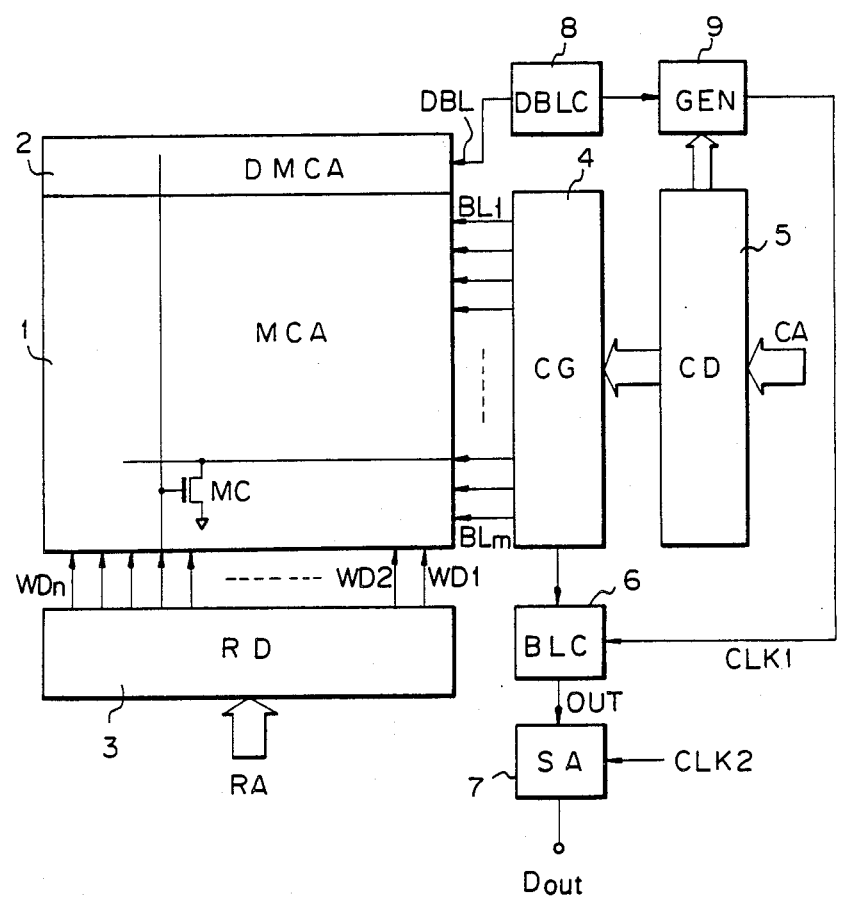
FIG. 1 is a block circuit diagram illustrating a semiconductor memory device as an embodiment of the present invention.

FIG. 1 illustrates a schematic structure of a CMOS mask ROM device as an embodiment of the present invention. The ROM device of FIG. 1 comprises a memory cell array 1 having a plurality of memory cells MC connected between bit lines BL1, ---, BLm and word lines WD1, WD2, --- WDn, and a dummy memory cell array 2 having a plurality of dummy memory cells DMC (not shown) connected between a dummy bit line DBL and the word lines WD1, WD2, ---, WDn. The ROM device of FIG. 1 further comprises a row decoder 3, a column gate 4, a column decoder 5, a bit line chargeup circuit 6, a sense amplifier 7, a dummy bit line chargeup circuit 8, and a clock generator 9.

The row decoder 3 decodes a row address RA and generates a word line selection signal applied to one of word lines WD1, WD2, ---, WDn. The column decoder 5 decodes a column address signal CA and supplies a bit line selection signal to the column gate 4 which connects one of bit lines BL1, ---, BLm to the bit line chargeup circuit 6 and to the sense amplifier 7 in accordance with the bit line selection signal. The dummy bit line chargeup circuit 8 charges the dummy bit line DBL and activates the clock generator 9 to generate a clock pulse CLK1. The bit line chargeup circuit 6 is activated by the clock pulse CLK1, and starts to chargeup a selected bit line. When the chargeup of the dummy bit line DBL is finished, the clock pulse CLK1 generated from the clock generator 9 is shut off and, thereby, the bit line chargeup circuit 6 stops charging the bit line. The sense amplifier 7 is activated by a clock pulse CLK2, and generates readout data Dout on the basis of an output signal OUT from a selected memory cell MC.

Figure 2:
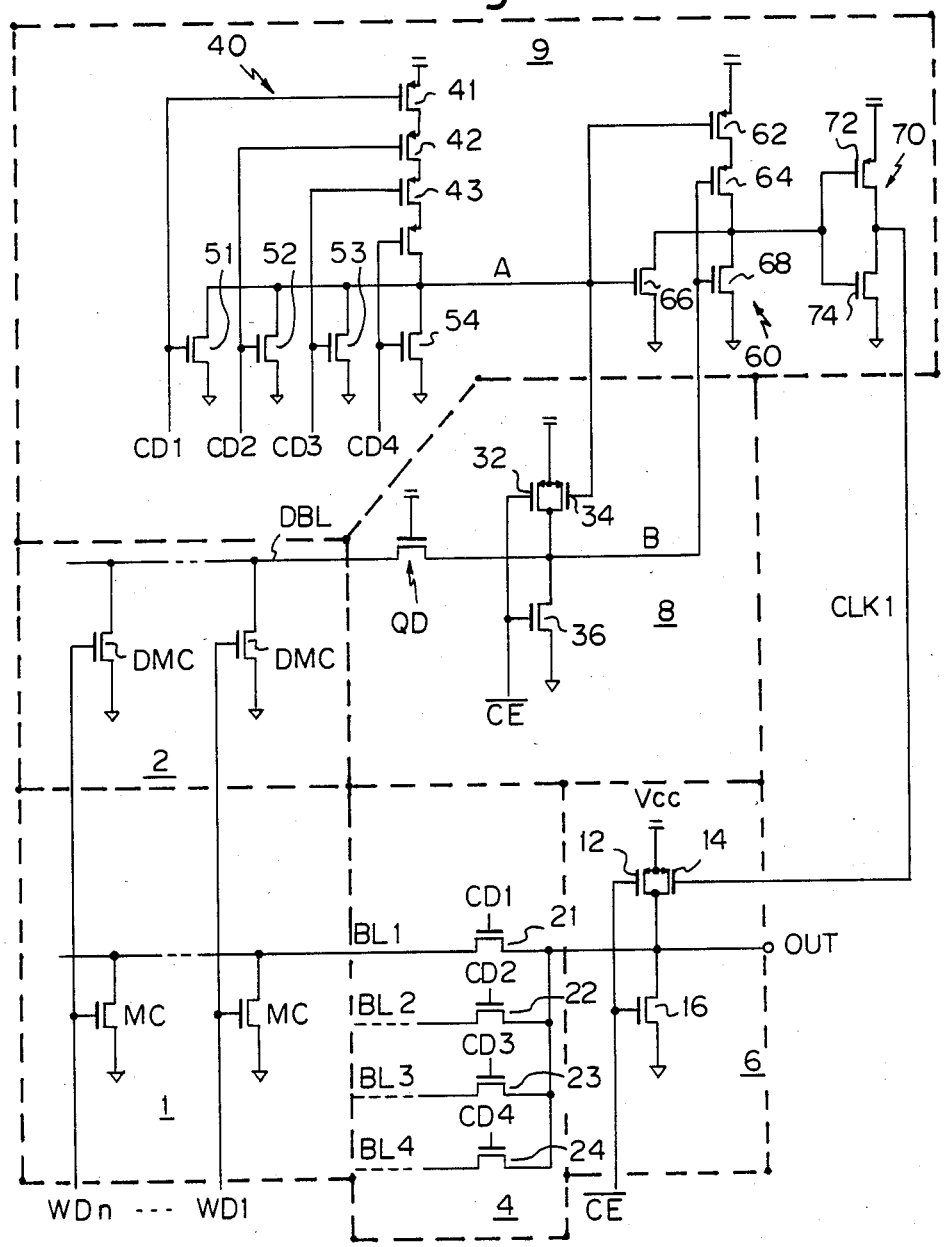
FIG. 2 is an electric circuit diagram illustrating a detailed structure of the memory device of FIG. 1.

FIG. 2 illustrates a detailed circuit structure of the ROM device of FIG. 1. As shown in FIG. 2, the memory cell array comprises a plurality of memory cells MC, each of which is comprised of an N-channel FET with a gate connected to one of the word lines WD1 to WDn. Each memory cell stores data "1" or "0" depending on the size of the thickness of the gate oxide film, the magnitude of impurity concentration of the channel regions, the presence of wiring connections, etc. For example, a memory cell storing data "1" means a thick gate oxide film, a high threshold voltage Vth, which will not turn ON even if the word line is selected and becomes H (HIGH) level. As opposed to this, a memory cell storing data "0" means a thin gate oxide film and a low Vth which will turn ON if the word line is selected and becomes H level, pulling down the bit line to the ground. Each bit line is commonly connected to an output terminal OUT via bit line selection transistors 21, 22, --- which are operated by outputs CD1, CD2, ---of the column decoders and which constitute the column gate 4. The output terminal OUT is for reading out the data stored in the memory cells and is connected to the sense amplifier 7 (shown only in FIG. 1). This output terminal is also connected with a bit line charging circuit 6. This is comprised of P-channel MOS transistors 12, 14, and an N-channel MOS transistor 16. The gates of the transistors 12 and 16 are supplied with an inverted chip enable signal $\overline{CE}$. The gate of the transistor 14 is supplied with a clock CLK1 output by a clock generating circuit 9.

The dummy memory cell array 2 comprises a plurality of dummy memory cells DMC connected to the dummy bit line DBL made in the same way as the bit lines BL1, BL2, --- of the memory cell array 1. The dummy memory cells DMC are connected to the dummy bit line DBL so as to add the same load as the normal bit lines. All of the dummy memory cells DMC are always kept in a turned OFF status. The gate of the transistor QD corresponding to 21, 22, --- and connecting the dummy bit line DBL to the output terminal B is connected to the power source and continually ON, i.e., the dummy bit line DBL is continually selected. The output terminal B has a dummy bit line precharging circuit 8 connected to it which is comprised of P-channel MOS transistors 32, 34, and an N-channel transistor 36. The gates of the transistors 32 and 36 are supplied with signal $\overline{CE}$, while the gate of the transistor 34 is supplied with the ouput of a NOR gate 40. The NOR gate 40 is provided with a plurality of P-channel MOS transistors 41, 42, --- connected in series and the same number of N-channel MOS transistors 51, 52, --- connected in parallel. The series connection points of the P- and N-channel MOS transistors form the output terminal A. The transistors 41 and 51, 42 and 52, --- are supplied with outputs CD1, CD2, --- of the column decoder. In FIG. 2, only four bit lines BL1, BL2, ---, BL4 are shown (as an example), with four series connected P-channel MOS transistors 41, 42, ---and four parallel connected N-channel MOS transistors 51, 52, ---. However, the number of transistors is increased or decreased in accordance with the number of bit lines. Reference numeral 60 is a second NOR gate comprised of P-channel MOS transistors 62 and 64 and N-channel MOS transistors 66 and 68 and obtains the NOR logic of the outputs A and B (the same reference characters given to the outupt terminals and outputs). Reference numeral 70 is an output stage inverter comprised of a P-channel MOS transistor 72 and N-channel MOS transistor 74 and outputs the above-mentioned clock CLK1. These NOR gates 40 and 60 and the output stage inverter 70 are included in the clock generating circuit 9.

In FIG. 2, of the illustrations, the row decoder 3, the column decoder 5 and the sense amplifier 7 are omitted for the sake of the simplicity. In the bit line charging circuit 6, the gm of the P-channel transistor 14 is sufficiently larger than that of the parallel connected P-channel transistor 12. Similarly, in the dummy bit line charging circuit 8, the gm of the P-channel transistor 34 is sufficiently larger than that of the parallel connected P-channel transistor 32. The P-channel transistors 12 and 32 are provided for preventing a fall in the potentials of the bit lines BL1, BL2, --- and the dummy bit line DBL due to leakage current.

Figure 3:
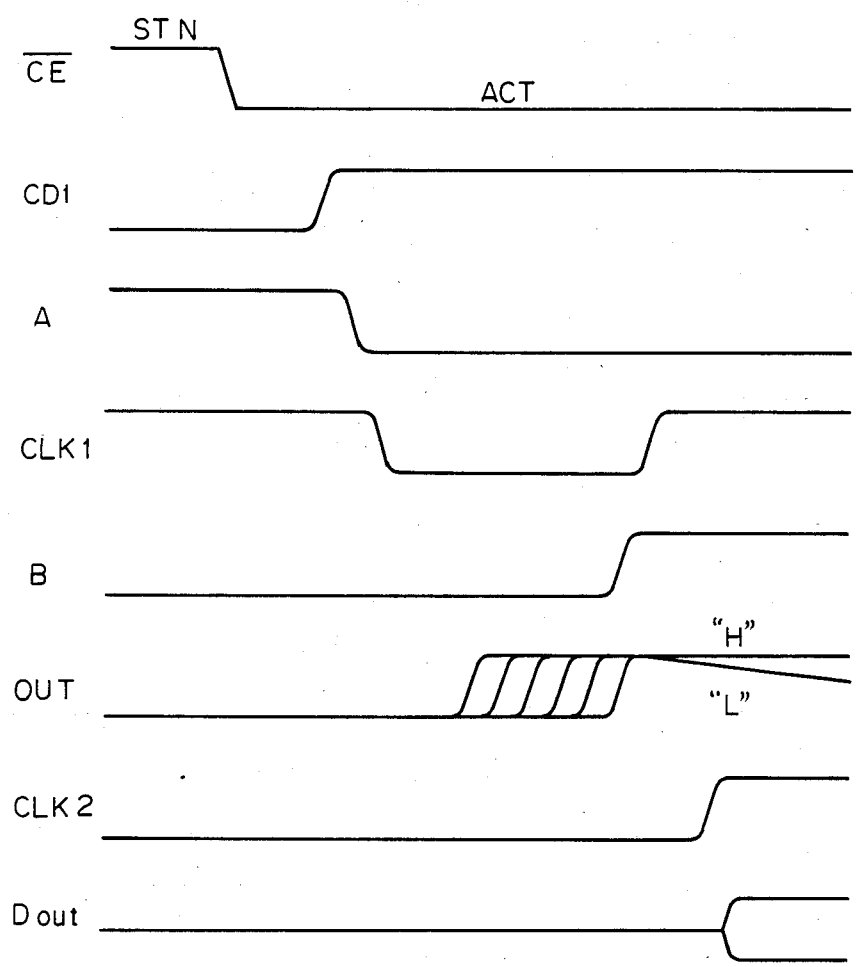
FIG. 3 is a waveform diagram illustrating signals of the circuit of FIG. 2.

Referring to the waveform diagram of FIG. 3, an explanation will be made of the operation of the ROM device shown in FIGS. 1 and 2. The inverted chip enable signal $\overline{CE}$ is at the H level on standby state STN, and at the L (LOW) level on active state ACT. During standby, the column decoder outputs CD1, CD2, --- are all L and the output A of the NOR gate 40 is H. Further, when the signal $\overline{CE}$ is H, in the charging circuit 8, the transistor 36 becomes ON, 32 becomes OFF, and 34 also becomes OFF, so the output B is L. Therefore, the output of the NOR gate 60 becomes L and the output CLK1 of the inverter 70 becomes H. In the charging circuit 6 of the memory portion, the transistor 16 is ON and the transistors 12 and 14 are OFF, so the output OUT is L.

When the standby state is changed to the active state, the signal $\overline{CE}$ becomes L and one of the column decoder outputs CD1, CD2, --- becomes H, whereupon one of the bit lines is selected. If the column decoder output which becomes H is CD1, in the NOR gate 40, the transistor 41 becomes OFF and the transistor 51 becomes ON, so the output A becomes L. In the charging circuit 8, the transistor 36 becomes OFF and the transistor 34 becomes ON, so the chargeup of the dummy bit line DBL begins. However, at the beginning of the start of the chargeup, since the output B is still at the L level, the two inputs A and B of the NOR gate 68 both become L and the outputs become H. Therefore, the output clock CLK1 of the inverter 70 becomes L. If the clock CLK1 becomes L, in the charging circuit 6, the P-channel transistor 14 becomes ON and the N-channel transistor 16 is OFF, so the chargeup of the end portion of the bit lines connected to the bit line chargeup circuit 6 and the bit line BL1 selected by the signal CD1 begins. The dummy bit line DBL is made in the same way as the bit lines BL1, BL2, ---, and therefore has the same charging characteristics as the bit lines. At this precharging stage, no memory cell selection is performed by the word lines, therefore all cells are OFF. This is the same as with the memory cells of the dummy bit line DBL. Considering the fact that there are some differences in the charging characteristics of the bit lines, the dummy bit line DBL may be given an additional capacitance so as to match the slowest bit line.

At approximately the same time as the charging of the bit line BL1 is completed, the charging of the dummy bit line DBL is also completed and the output B of the dummy bit line charging circuit 8 becomes H level. Therefore, the output of the NOR gate 60 becomes L and the output clock CLK1 of the inverter 70 becomes H. As a result, in the charging circuit 6, the transistor 14 becomes OFF and the charging comes to an end. After this, the word line selection is performed. For example, when WD1 is made H, if the memory cell MC has a low threshold which corresponds to write data "0" in the above-mentioned example, the cell becomes ON and pulls down the bit line BL1 to the ground. If the memory cell has a high threshold, the cell remains OFF and the bit line BL1 is not pulled down. In FIG. 3, this is indicated by the "H" and "L" of the output OUT.

After the potential of the bit line BL1 is changed slightly in accordance with the data stored in the memory cell MC, the sense amplifier 7 is activated by another clock signal CLK2 and outputs readout data Dout corresponding to the output signal OUT. The sense amplifier 7 is constituted, for example, by a flip-flop type circuit or a differential amplifier type circuit, and becomes, for example, to a high output impedance state when not activated by the clock signal CLK2. The clock signal CLK2 is generated, for example, by delaying the output signal B and gating the delayed signal by the inverted chip enable signal $\overline{CE}$.

In the circuit of FIG. 2, when the inverted chip enable signal $\overline{CE}$ becomes L, i.e., active state, the transistor 12 becomes on together with the transistor 16 becoming OFF. However, the gm of the transistor 12 is small and the bit line is substantially charged by the transistor 14 whose gm is large. Therefore, during the chargeup operation by the transistor 14, even if the word line is placed in the selected state, an accurate data output level does not appear on the bit line. Therefore, to make the readout operation as fast as possible, it is necessary to complete the substantial precharging operation as fast as possible. Even if the clock CLK1 returns to H and the transistor 14 becomes OFF, since the transistor 12 is ON, the L level of the output OUT is the value determined by the gm ratio of the selected memory cell and the transistor 12. This is smaller in amplitude compared with the case where the output OUT is changed between Vcc and Vss, and enables high speed operation.

In this circuit, the clock CLK1 for bit line precharging is generated when the memory device changes from the standby state to the active state and the column decoder gives off an output. At the time, approximately, that the bit line precharging comes to an end, this is detected by the dummy bit line and the clock CLK1 is extinguished, therefore it is possible to perform the bit line charging at the necessary time for the necessary period without the intervention of excess time, and thus a high speed memory readout is achieved.

Figure 4:
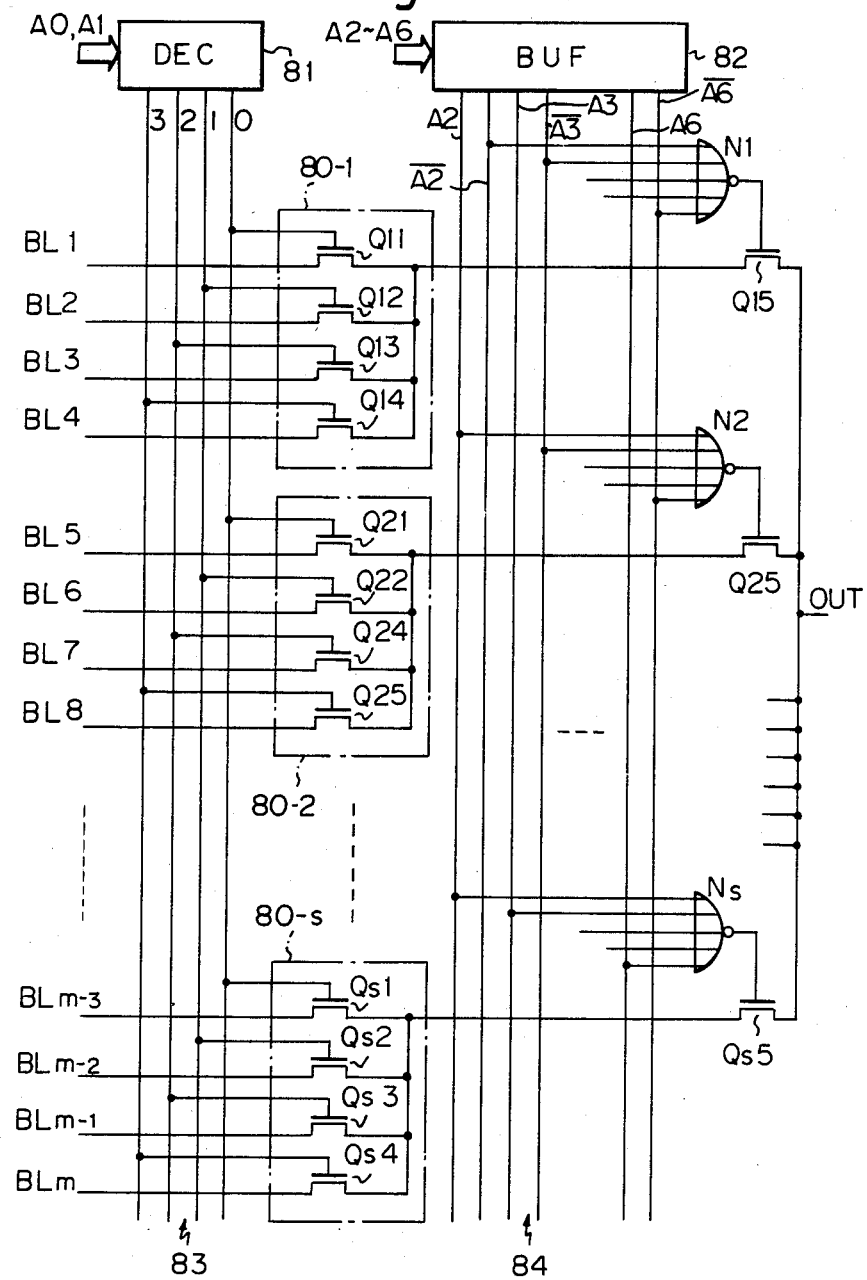
FIG. 4 is a circuit diagram illustrating a column gate circuit used in a semiconductor memory device as another embodiment of the present invention.

FIG. 4 illustrates another example of a column gate circuit which can be substituted for the column gate circuit 4 of the circuit of FIG. 2. The circuit of FIG. 4 comprises a plurality of column gate units 80-1, 80-2, ---, 80-s, the same number of NOR gates N1, N2, ---, Ns, the same number of gate transistors Q15, Q25, ---, Qs5, an address decoder 81, and an address buffer 82. The column gate units 80-1, 80-2, ---, 80-s comprises column gate transistors Q11, Q12, Q13, Q14; Q21, Q22, Q23, Q24; ---; Qs1, Qs2, Qs3, Qs4, respectively. Each of these column gate transistors is connected between a bit line and a gate transistor corresponding to the column gate unit including the column gate transistor. For example, the column gate transistor Q11 is connected between the bit line BL1 and the gate transistor Q15, and the column gate transistor Q22 is connected between the bit line BL6 and the gate transistor Q25.

In the circuit of FIG. 4, each of the column gate units 80-1, 80-2, ---, 80-s selects one of four bit lines in accordance with two bits of column address data A0 and A1 which are decoded by the address decoder 81. One of the gate transistors Q15, Q25, ---, Qs5 is turned ON to select one of the column gate units 80-1, 80-2, ---, 80-s, in accordance with, for example, five bits of column address data A2 to A6 applied to the address buffer 82.

Since the column gate circuit of FIG. 4 has a two stage gate structure, i.e., column gate units 80-1, 80-2, ---, 80-s and the gate transistors Q15, Q25, ---, Qs5, the structure of the column gate circuit is simplified and the number of decoder lines 83 connected to the decoder 81 and to the column gate units 80-1, 80-2, ---, 80-s and the number of address lines 84 connected to the address buffer 82 and to the NOR gates N1, N2, ---, Ns are greatly decreased.

In the above, embodiments of a mask ROM device were mentioned. The present invention, however, is not limited to a mask ROM device, but can be applied to all clock synchronous type memory devices requiring advance precharging based on clock signals for setting the memory device in a chip enabled status.

I claim:
1. A semiconductor memory device comprising:
a plurality of bit lines;
a gate circuit for selecting a desired bit line;
a dummy bit line having a chargeup characteristic equivalent to that of each of said bit lines;
a dummy bit line chargeup circuit for charging said dummy bit line;
a chargeup circuit for charging up a selected bit line; and
means responsive to selection of a desired bit line for starting operation of both said dummy bit line chargeup circuit and said selected bit line chargeup circuit, and for detecting a predetermined charge potential of said dummy bit line, said means comprising a clock generating circuit for generating a clock signal which becomes active from the time said bit line is selected to the time chargeup of said dummy bit line reaches said predetermined charge potential wherein said clock generating circuit comprises a first gate circuit for generating an output signal indicating that any bit line is selected and a second gate circuit which generates said clock signal based on said output signal from said first gate circuit and said predetermined charge potential level of said dummy bit line, to stop operation of both said chargeup circuits, thereby completing a precharge period for the selected bit line.

2. A semiconductor memory device according to claim 1, wherein said first gate circuit is a NOR gate circuit and said second gate circuit includes a second NOR gate and an inverter connected to said second NOR gate.

3. A semiconductor memory device according to claim 1, wherein said gate circuit for selecting a desired bit line comprises a plurality of transfer gate transistors each connected between a bit line and an output terminal of said gate circuit.

4. A semiconductor memory device according to claim 1, wherein said gate circuit for selecting a desired bit line comprises a plurality of first groups of transfer gate transistors each group selecting a bit line among a group of bit lines, and a second group of transfer gate transistors for selecting a bit line among a plurality of bit lines selected by said first groups of transfer gate transistors.

5. A semiconductor memory device according to claim 1, wherein said chargeup circuit comprises a series connection of first and second transistors connected between first and second power terminals of a power source, the common connection point of said first and second transistors being connected to the output terminal of said gate circuit for selecting a desired bit line, said first transistor being turned on by said clock signal, and said second transistor being controlled by a chip enable signal.

6. A semiconductor memory device according to claim 5, wherein said chargeup circuit further comprises a third transistor connected in parallel to said first transistor and controlled by said chip enable signal.

7. A semiconductor memory device according to claim 1, wherein a plurality of memory cells are connected to each of said bit lines, and the same number of dummy memory cells are connected to said dummy bit line.

8. A semiconductor memory device according to claim 7, wherein said memory cells and said dummy memory cells are comprised of MOS transistors, said MOS transistors of said dummy memory cells are always kept in a turned off condition.

9. A semiconductor memory device according to claim 8, wherein thickness of gate insulation film of each of said MOS transistors of said memory cells is changed in accordance with data stored in said memory cell.

10. A semiconductor memory device according to claim 8, wherein an impurity concentration of a channel region of each of said MOS transistors of said memory cells is changed in accordance with the data stored in said memory cell.

11. A semiconductor memory device comprising:
a plurality of bit lines;
a gate circuit for selecting a desired bit line;
a dummy bit line having a chargeup characteristic equivalent to that of said bit lines;
a dummy bit line chargeup circuit for charging said dummy bit lines;
a chargeup circuit for charging a selected bit line; and
means responsive to selection of a desired bit line for starting operation of both said dummy bit line chargeup circuit and said selected bit line chargeup circuit, and for detecting a predetermined charge potential of said dummy bit line to stop operation of both said chargeup circuits, thereby completing a precharge period for said selected bit line;
wherein said dummy bit line chargeup circuit comprises a series connection of first and second transistors connected between first and second power terminals of a power source, the common connection point of said first and second transistors being connected to said dummy bit line, said first transistor being turned on after the time said bit line is selected, and said second transistor being controlled by a chip enable signal.

12. A semiconductor memory device according to claim 11, wherein said common connection point is connected to said dummy bit line via a dummy transistor having the transfer characteristic equivalent to that of said gate circuit for selecting a desired bit line.

13. A semiconductor memory device according to claim 11, wherein said dummy bit line chargeup circuit further comprises a third transistor connected in parallel to said first transistor and controlled by said chip enable signal.

* * * * *